US012255736B2

(12) United States Patent
Lechner

(10) Patent No.: US 12,255,736 B2
(45) Date of Patent: Mar. 18, 2025

(54) PROVIDING LOCALIZED JAMMING EFFECTS IN A TRAINING EXERCISE

(71) Applicant: The Boeing Company, Chicago, IL (US)

(72) Inventor: Robert James Lechner, Weldon Spring, MO (US)

(73) Assignee: The Boeing Company, Arlington, VA (US)

( * ) Notice: Subject to any disclaimer, the term of this patent is extended or adjusted under 35 U.S.C. 154(b) by 1096 days.

(21) Appl. No.: 16/854,783

(22) Filed: Apr. 21, 2020

(65) Prior Publication Data

US 2021/0328705 A1  Oct. 21, 2021

(51) Int. Cl.
| | |
|---|---|
| *H04K 3/00* | (2006.01) |
| *B64D 45/00* | (2006.01) |
| *G06F 30/20* | (2020.01) |
| *G09B 9/00* | (2006.01) |
| *G09B 9/54* | (2006.01) |
| *G01S 7/38* | (2006.01) |
| *G01S 19/01* | (2010.01) |
| *G09B 9/08* | (2006.01) |
| *G09B 9/44* | (2006.01) |

(52) U.S. Cl.
CPC .............. *H04K 3/68* (2013.01); *B64D 45/00* (2013.01); *G06F 30/20* (2020.01); *G09B 9/003* (2013.01); *G09B 9/54* (2013.01); *G01S 7/38* (2013.01); *G01S 19/015* (2013.01); *G09B 9/085* (2013.01); *G09B 9/44* (2013.01)

(58) Field of Classification Search
CPC .......... H04K 3/68; G06F 30/20; B64D 45/00; G09B 9/003; G09B 9/54; G09B 9/085; G09B 9/44; G01S 7/38; G01S 19/015
See application file for complete search history.

(56) References Cited

U.S. PATENT DOCUMENTS

| | | | | |
|---|---|---|---|---|
| 5,549,477 | A | * | 8/1996 | Tran .................. G01S 7/021 |
| | | | | 342/13 |
| 7,826,839 | B1 | * | 11/2010 | Nicholas ................. H04K 3/28 |
| | | | | 455/12.1 |
| 8,616,884 | B1 | | 12/2013 | Lechner et al. |
| 8,986,011 | B1 | | 3/2015 | Sowadski et al. |
| 9,099,009 | B2 | | 8/2015 | Sowadski et al. |
| 9,230,446 | B1 | | 1/2016 | Mendro et al. |
| 9,262,939 | B2 | | 2/2016 | Lechner et al. |
| 9,721,478 | B2 | | 8/2017 | Wilcox et al. |
| 2002/0053989 | A1 | * | 5/2002 | Lin .................... H04K 3/90 |
| | | | | 342/357.59 |

(Continued)

FOREIGN PATENT DOCUMENTS

KR          101062277 B1 *  9/2011 ............... H04K 3/68

*Primary Examiner* — Keith Ferguson
(74) *Attorney, Agent, or Firm* — Alleman Hall & Tuttle LLP

(57) ABSTRACT

A method for providing localized jamming effects includes using a processor onboard a vehicle to perform the steps of: receiving a jamming command to simulate a jamming effect on a particular sensor onboard the vehicle; and generating a jamming effect in a model of the particular sensor in response to the jamming command. The jamming effect in the model of the particular sensor simulates the jamming effect on the particular sensor being generated by an entity other than the vehicle.

17 Claims, 5 Drawing Sheets

(56) References Cited

U.S. PATENT DOCUMENTS

| | | | |
|---|---|---|---|
| 2011/0223851 A1* | 9/2011 | Stoddard | H04K 3/44 455/1 |
| 2012/0156653 A1* | 6/2012 | Wokurka | G09B 9/16 434/30 |
| 2017/0294135 A1 | 10/2017 | Lechner | |
| 2018/0293909 A1 | 10/2018 | Lechner | |

* cited by examiner

PROVIDING LOCALIZED JAMMING EFFECTS IN A TRAINING EXERCISE

FIELD

The present disclosure relates to providing localized jamming effects in a training exercise.

BACKGROUND

Live, virtual, constructive training exercises are training exercises that include real physical entities, simulated physical entities, and physical situations and conditions in an environment for purposes of training. One application of live, virtual, constructive training is in military training, for example training military pilots and crews. Using actual equipment and weapons is expensive. Training with a jammer effect on actual aircraft can be costly and complex due to hardware requirements to actually transmit jammer signals. Accordingly, if physical situations and conditions can be simulated, aggressor aircraft and ground elements can be simulated, significant cost savings can be realized.

SUMMARY

In accordance with an example, a method for providing localized jamming effects includes: using a processor onboard a vehicle to perform the steps of: receiving a jamming command to simulate a jamming effect on a particular sensor onboard the vehicle; and generating a jamming effect in a model of the particular sensor in response to the jamming command. The jamming effect in the model of the particular sensor simulates the jamming effect on the particular sensor being generated by an entity other than the vehicle.

In accordance with another example, a system for providing localized jamming effects includes a processor onboard a vehicle and a memory associated with the processor. The memory includes computer-readable program instructions that, when executed by the processor causes the processor to perform a set of functions including receiving a jamming command to simulate a jamming effect on a particular sensor onboard the vehicle. The set of functions also include generating a jamming effect in a model of the particular sensor in response to the jamming command. The jamming effect in the model of the particular sensor simulates the jamming effect on the particular sensor being generated by an entity other than the vehicle.

In accordance with another example, a training pod includes a training system. The training system includes a radio interference generator and a radar model of a radar associated with a vehicle. The training system also includes a model of a location sensor associated with the vehicle and a jammer function. The jammer function is configured to: generate simulated communications jamming effects in a communications device associated with the vehicle; generate simulated radar jamming effects in the radar model of the radar associated with the vehicle; and generate simulated location data jamming effects in the model of a location sensor associated with the vehicle.

The features, functions, and advantages that have been discussed can be achieved independently in various examples or may be combined in yet other examples further details of which can be seen with reference to the following description and drawings.

DETAILED DESCRIPTION

Figure 1:
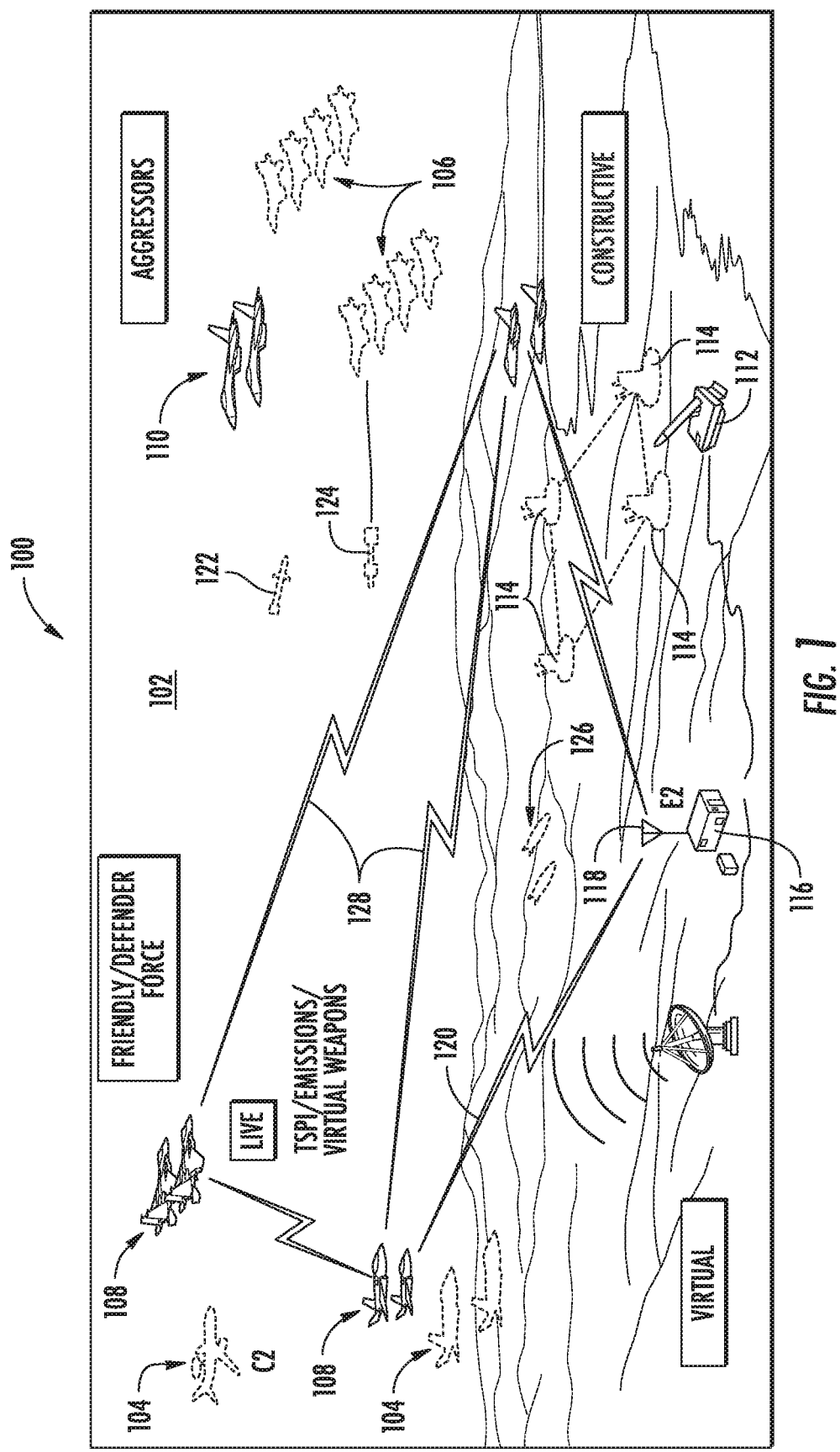
FIG. 1 is an illustration of an example of a training exercise in accordance with some examples of the present disclosure.

The following detailed description of examples refers to the accompanying drawings, which illustrate specific examples of the disclosure. Other examples having different structures and operations do not depart from the scope of the present disclosure. Like reference numerals may refer to the same element or component in the different drawings.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

FIG. 1 is an illustration of an example of a training exercise 100 in accordance with some examples of the present disclosure. The training exercise 100 is illustrated as an example of a live, virtual, and constructive (LVC) training exercise, which, as used herein, refers to a training exercise in which virtual actors interact with real (i.e., physical) actors. In other examples, other types of simulations are contemplated (e.g., stand-alone, simulation, emulation, stimulation, and the like). In the example illustrated in FIG. 1, the training exercise 100 includes a simulated air combat training environment 102 during a live flight of physical aircraft. The simulated air combat training environment 102 is also referred to herein as simply the simulated environment 102. FIG. 1 may be a screen shot of the simulated environment 102 presented to a pilot in a live aircraft. The simulated environment 102 includes virtual and/or constructive aircraft 104 and 106 and real aircraft 108 and 110. The virtual and/or constructive aircraft 104 and 106 include friendly or defender virtual and/or constructive aircraft 104 performing a defender role and aggressor virtual aircraft 106 performing an aggressor role in the simulated air combat training environment 102. Similarly, the real aircraft 108 and 110 include friendly or defender real aircraft 108 performing a defender role and aggressor real aircraft 110 performing an aggressor role in the simulated air combat training environment 102.

Figure 2:
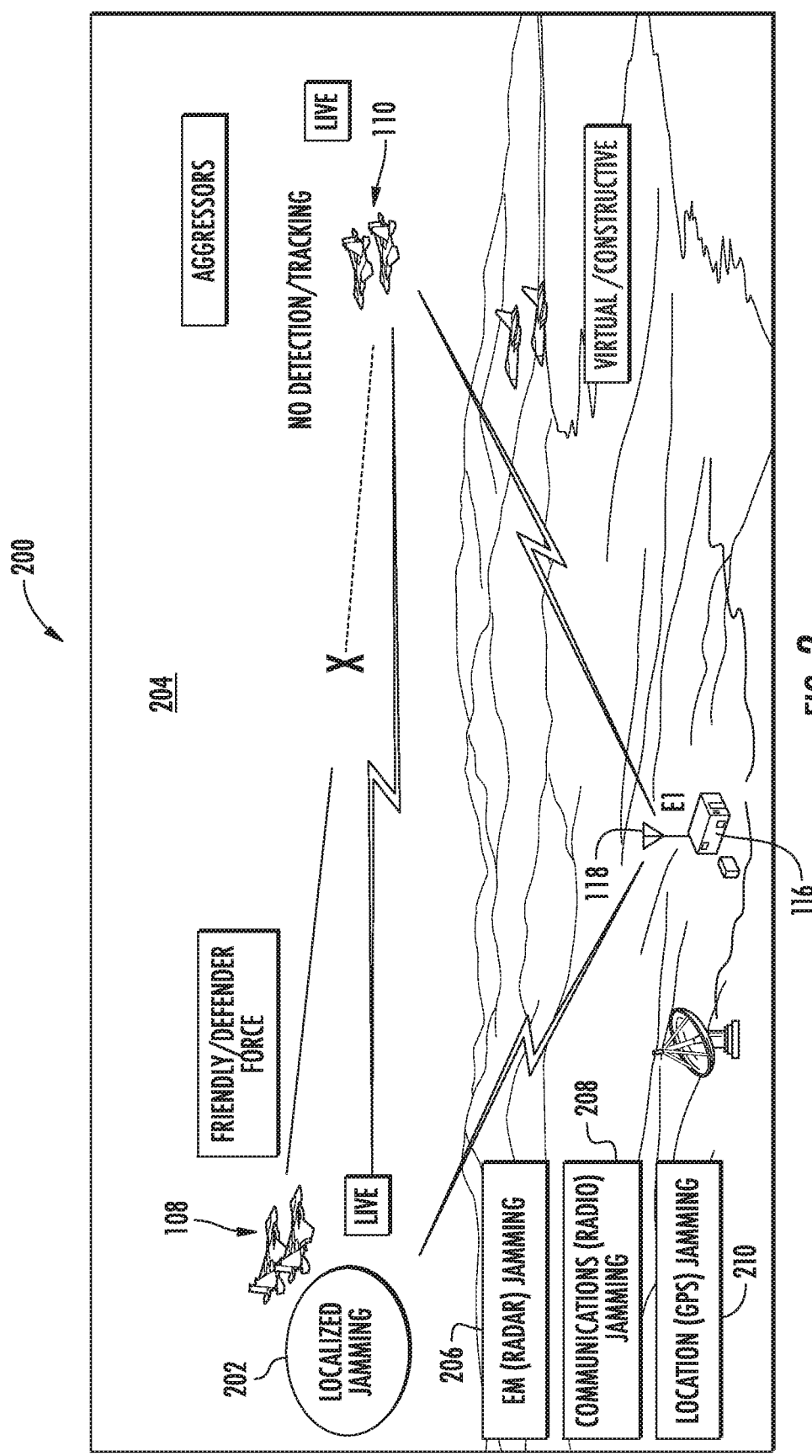
FIG. 2 is an illustration of an example of a training exercise including localized jamming effects performed by simulation onboard a vehicle in accordance with some examples of the present disclosure.

The simulated environment 102 includes a variety of different virtual objects, some of which represent real things in the physical world and some of which are entirely virtually created, and some of which are constructive representations of real objects but are modified for purposes of the simulation. In the simulated environment 102, aircraft 108 and 110 are real. Aircraft 104 and 106 are only virtual or constructive representations. Vehicle 112 is real while vehicles 114 are virtual representations of real vehicles. Ground station 116 is real and includes an antenna 118 for transmitting signals, e.g., jamming signals 120 to the real aircraft 108 and 110 and real vehicle 112. As describe in more detail herein, at least one of the ground station 116, the real aircraft 108 and 110, and the real vehicle 112 include a training system 302 (FIG. 3) for providing localized jamming or jamming effects 202 (FIG. 2) to simulate a jamming effect on one or more sensors onboard a vehicle 300 (FIG. 3) or real aircraft 108 and 110 in the simulated environment 102. In some examples, the training system 302 is a live, virtual, constructive (LVC) training system. In some examples, the ground station 116 is not present. The ground station 116 can enhance capability but is not a necessary element of a training exercise 100 or 200 as illustrated in FIGS. 1 and 2. The aircraft 108 and 110 can communicate with each other over a simulated link without a ground station 116 being present.

The localized jamming effects 202 are generated on the real vehicle 300 or real aircraft 108 and 110 impacted rather than the jamming effects being generated remotely by another vehicle, aircraft or ground station and then being transmitted to the vehicle or aircraft that is to be impacted by the jamming effects. The training system 302 or systems avoids having to deploy actual expensive jamming equipment on each of the real aircraft 108 and 110, real vehicle 112 and ground station 116 for transmitting jamming signals 120 and 128 to the real aircraft 108 and 110 that are to be affected by the jamming signals 120 and 128 as illustrated in the example in FIG. 1.

The simulated environment 102 also includes simulated weapons deployment. For example, defender missile 122, aggressor missile 124, and bombs 126 are all simulated. In this manner, pilots can train with real weapons systems in real flight under a variety of different conditions without actually deploying real weapons.

FIG. 2 is an illustration of an example of a training exercise 200 including localized jamming effects 202 performed by simulation onboard a vehicle or real aircraft 108 and 110 in accordance with some examples of the present disclosure. The training exercise 200 illustrated in FIG. 2 is an example of an implementation of the training exercise 100 of FIG. 1. Specifically, the training exercise 200 includes localized simulated jamming effects 202 of one or more sensors onboard the real aircraft 108 and 110. Examples of the localized simulated jamming effects 202 include but are not necessarily limited to electromagnetic (EM) sensor jamming 206, communications jamming 208, and location sensor jamming 210. An example of EM sensor jamming 206 includes Radio Detection and Ranging (RADAR) jamming. An example of location sensor jamming 210 includes Global Position System (GPS) sensor jamming or inertial navigation system jamming. Jamming, as used herein, refers to any form of interfering with or interjecting errors into the signal (e.g., spoofing). In some examples, the localized simulated jamming or jamming effects 202 is performed by a training system 302 (FIG. 3) on one or more of the real aircraft 108 and 110 and ground station 116. As described in more detail herein, the training system 302 is onboard the real aircraft 108 and 110, or the training system 302 is in a training pod 332 that is removably mounted to the real aircraft 108 and 110 for training purposes. In some examples, the training pod 332 is an LVC training pod.

Figure 3:
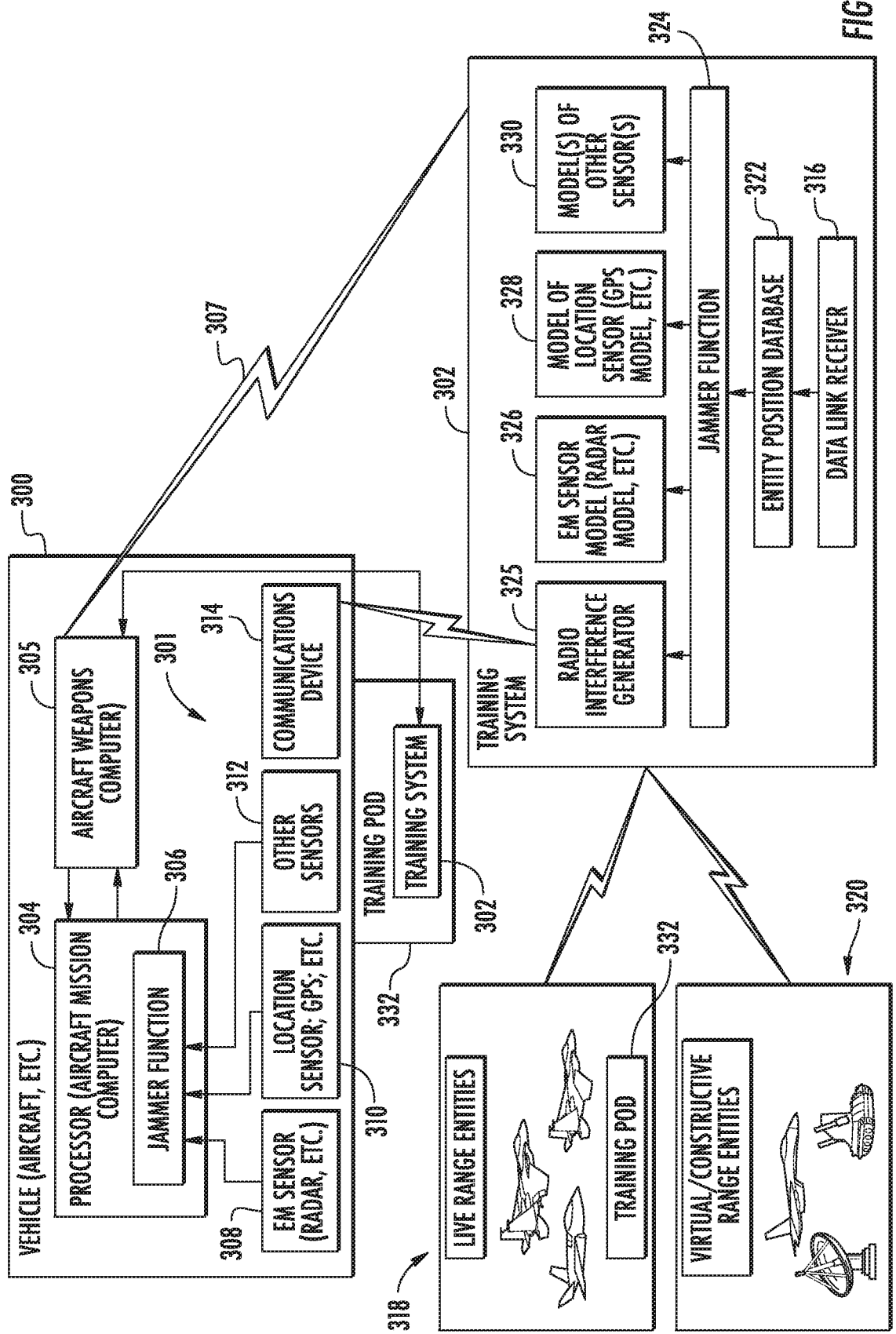
FIG. 3 is a block schematic diagram of an example of a vehicle and a system for localized jamming in accordance with some examples of the present disclosure.

FIG. 3 is a block schematic diagram of an example of a vehicle 300 and a training system 302 for localized jamming in accordance with some examples of the present disclosure. In accordance with an example, the training system 302 is a live, virtual, constructive (LVC) training system. In some examples, the vehicle 300 is an aircraft, such as real aircraft 108 and 110 in FIGS. 1 and 2. The vehicle 300 includes a processor 304. In examples where the vehicle 300 is an aircraft, such as real aircraft 108 and 110 in FIGS. 1 and 2, the processor 304 is an aircraft mission computer 304. The real aircraft 108 and 110 also include an aircraft weapons computer 305. The aircraft weapons computer 305 is configured to control targeting and deployment of weapons carried by the real aircraft 108 and 110, for example. In some examples, the aircraft weapons computer 305 is also configured to receive signals 307 from a training system 302 at a ground station 116 or from a training system 302 associated with an entity other than the vehicle 300, e.g., live range entity 318, or another real aircraft 108 or 110 in the simulated environment 102 or 204.

In some examples, the processor 304 includes a jammer function 306. Accordingly, in the example in FIGS. 1 and 2, the jammer function 306 is part of the aircraft mission computer of the real aircraft 108 and 110. The jammer function 306 is configured to receive input or data from an electromagnetic (EM) sensor 308, position data from a location sensor 310, data from any other sensors 312 onboard the vehicle 300 or real aircraft 108 and 110, and signals from one or more communications devices 314. An example of the EM sensor 308 includes a RADAR device. An example of a location sensor 310 includes a GPS device, an inertial navigation device or other location determining device. The jammer function 306 is also configured to interfere with radio frequency (RF) signals or wireless signals received by the one or more communications devices 314. For example, the jammer function 306 degrades the one or more communications devices 314 by simulating noise or other interference in the RF or wireless signals received by the communications device 314.

The jammer function 306 is also configured to enable errors in a model of an EM sensor 308 or RADAR model and enables a radio interference generator 325. The jammer function 306 is further configured to enable errors in a model of a location sensor 310 model or GPS model and enables error positions in the real aircraft 108 or 110 in FIGS. 1 and 2.

The training system 302 includes a data link receiver 316 that is configured to send and receive data. For example, the data link receiver 316 is configured to send and receive data from the vehicle 300 or aircraft 108 and 110 (FIGS. 1 and 2) and from live range entities 318 and virtual/constructive range entities 320 within the simulated environment 102 and 204 in FIGS. 1 and 2. The live range entities 318 correspond to live or real aircraft 108 and 110 and vehicles 112 in the simulated environment 102 in FIGS. 1 and 204 in FIG. 2. The virtual/constructive range entities 320 correspond to the virtual and/or constructive aircraft 104 and 106 and vehicles 114 in the simulated environment 102 in FIG. 1 The data link receiver 316 receives position or location data from other entities 318 and 320 within the simulated environment 102 and 204. The other entities 318 and 320 are also referred to as external entities 318 and 320.

The training system 302 also includes an entity position database 322. The entity position database 322 is configured to track positions of virtual/constructive range entities 320 and representations of live range entities 318 in the simulated environment 102 or 204.

The training system 302 additional includes a jammer function 324. In some examples, the jammer function 324 is the same as the jammer function 306 onboard the vehicle 300 or real aircraft 108 and 110. The training system 302 further includes a radio interference generator 325, an EM sensor model 326 or RADAR model, a model 328 of a location sensor, and one or more models 330 of other sensors. Similar to that previously described, the jammer function 324 is configured to enable error in the EM sensor model 326 or RADAR model. The jammer function 324 is also configured to enable error in a model 328 of a location sensor or GPS model, and the jammer function 324 is configured to enable errors in other sensor models 330. In some examples, the jammer function 324 also enables the radio interference generator 325. The radio interference generator 325 is configured to generate RF or wireless signals that interfere with a communication device 314 or radio of the vehicle 300 or real aircraft 108 and 110 (FIGS. 1 and 2). For example, the radio interference generator 325 degrades the vehicle or aircraft communications device 314 or radio by introducing simulated noise or other spurious signals being received by the communications device 314. In some examples, the radio interference generator 325 generates low-power interference (noise) on the same frequencies that the vehicle 300 communications device 314 or real aircraft 108 and 110 radio (UHF/VHF radio) operates so as to appear to jam radio communications on the receiving communications device 314 or ownship radio.

In accordance with some examples, the training system 302 is embodied in the ground station 116 in FIGS. 1 and 2. In the example in FIG. 3 the aircraft weapons computer 305 receives communication signals 307 from the training system 302.

In some examples, a training pod 332 is removably mounted to the vehicle 300 or aircraft 108 or 110 for participation in a training exercise, such as the training exercises 100 and 200 illustrated in FIGS. 1 and 2. The training pod 332 includes a training system 302 that is the same as that previously described. In some examples, the live range entities 318 also each include a training pod 332. In accordance with some examples, any combination of the vehicle 300, real aircraft 108 and 110 (FIGS. 1 and 2) or live range entities 318, real vehicles 112, and ground station 116 or stations each include a training system 302. In some examples, the training systems 302 are integrated onboard the vehicle 300 or real aircraft 108 and 110 rather than training pods 332 that are removably mounted to the vehicle 300 or real aircraft 108 and 110 or live range entities 318.

Figure 4:
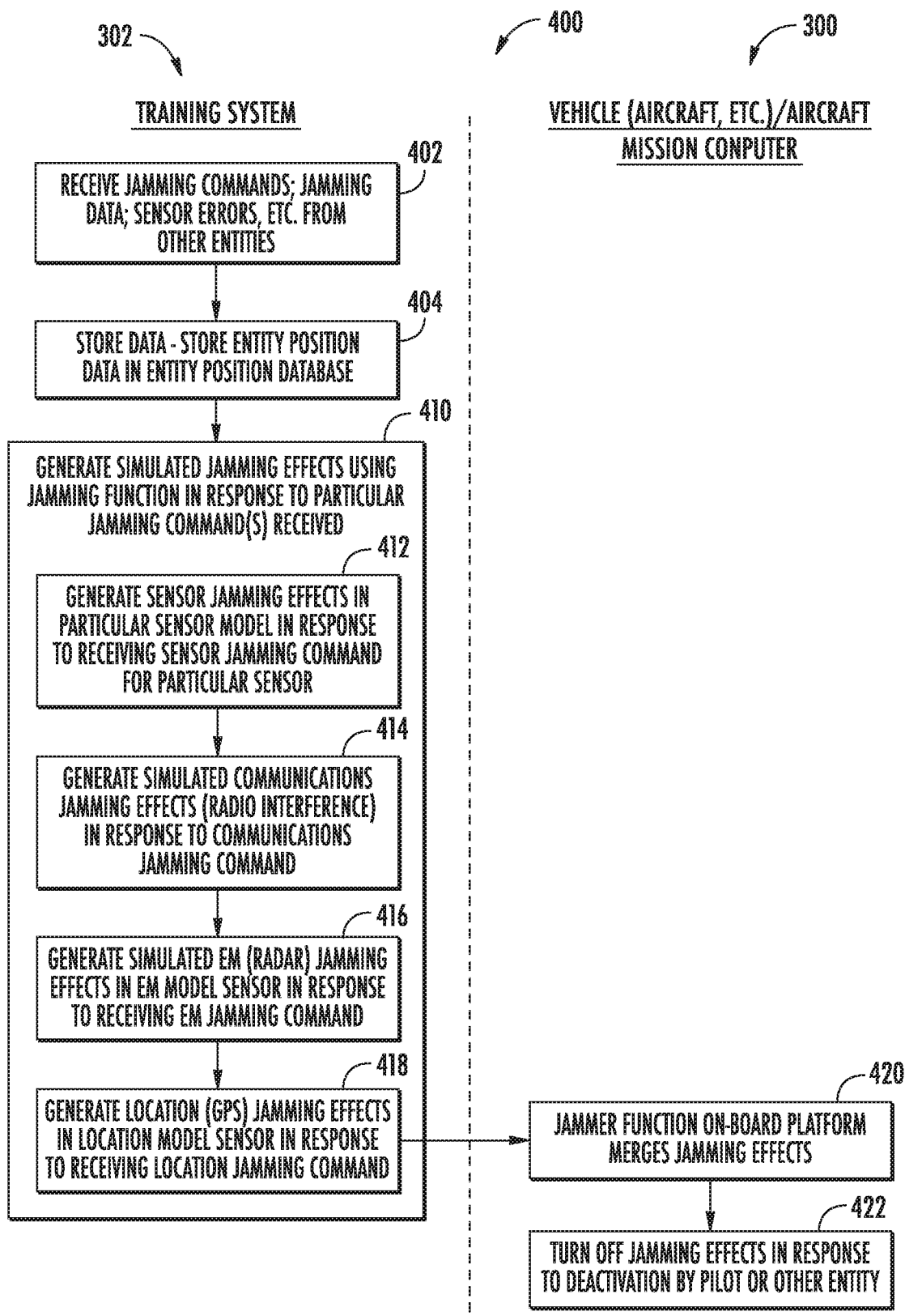
FIG. 4 is a flow chart of an example of a method for localized jamming in accordance with some examples of the present disclosure.

FIG. 4 is a flow chart of an example of a method 400 for localized jamming in accordance with some examples of the present disclosure. In some examples, the method 400 is at least partially performed by the training system 302. The exemplary method 400 is divided into those functions performed by the training system 302 and those functions performed by a vehicle, such as vehicle 300, aircraft 108 or 110, or performed by an aircraft mission computer 304 or jammer function 306 operating on the aircraft mission computer 304. As previously described, in some examples, the training system 302 is integrated onboard the vehicle 300 or real aircraft 108 and 110. In other examples, the training system 302 is in a training pod 332 removably mounted to the vehicle 300 or real aircraft 108 and 110.

In block 402, a jamming command is received to simulate a jamming effect on a particular sensor onboard the vehicle 300 or aircraft 108 or 110. The jamming command is received from one of the ground station 116 or from a live range entity 318 in the simulated environment 102 or 204, such as one of the real aircraft 108 or 110. In some examples, a different jamming command is received for each different type of localized jamming effect 202. As previously described, examples of different types of localized jamming effects 202 include but are not necessarily limited to EM sensor jamming 206, communications jamming 208, and location sensor jamming 210. In examples, a single jamming command is received for generating all of the localized jamming effects 202.

In some examples, jamming data, training data or other data are also received from other entities in the simulated environment, such as simulated environment 102 (FIG. 1) or 204 (FIG. 2). The one or more jamming commands and/or jamming data are received from other entities, such as live range entities 318 or other training systems 302, within the simulated environment 102 or 204.

In block 404, the jamming data, training data and/or other data are stored by the training system 302. For example, position data of entities 318 and 320 within the simulated environment 102 or 204 is stored in the entity position database 322 (FIG. 3).

In block 410, a jamming effect is generated in a model of a particular sensor in response to the jamming command. The jamming effect in the model of the particular sensor simulates the jamming effect on the particular sensor being generated by an external entity or an entity other than the vehicle 300 or real aircraft 108 itself, e.g., a live range entity 318, a virtual/constructive range entity 320 or ground station 116. As previously discussed, different jamming effects are generated in models of different types of sensors based on the one or more jamming commands received. In some examples, generating the jamming effect in the model of the particular sensor includes at least one of: generating simulated communications jamming effects in one or more communications devices associated with the vehicle; generating simulated electromagnetic jamming effects in a sensor model of an electromagnetic sensor associated with the vehicle; and generating simulated location data jamming effects in a model of a location sensor associated with the vehicle.

In some examples, the vehicle is a live aircraft participating in a training exercise and receiving the jamming command includes receiving the jamming command from one of an aggressor aircraft, a friendly aircraft, or a ground station.

In block 412, sensor jamming effects are generated in a particular sensor model in response to receiving a sensor jamming command for the particular sensor. Examples of the different types of sensor models include but are not limited to an EM sensor model, a location sensor model and a communications device. Generating the jamming effect in the model of the particular sensor includes simulating the jamming effect on the particular sensor coming from one of a plurality of entities in a training exercise.

Generating the jamming effect in the model of the particular sensor includes at least one of: generating simulated communications jamming effects in one or more communications devices associated with the vehicle in block 414; generating simulated EM (RADAR) jamming effects in a sensor model of an EM sensor (RADAR) associated with the vehicle in block 416; and generating simulated location (GPS) data jamming effects in a model of a location sensor (GPS) associated with the vehicle in block 418.

In block 414, simulated communications jamming effects (radio interference) are generated in response to a communications jamming command being received by the vehicle 300 or real aircraft 108. Generating the simulated communications jamming effects includes generating radio interference on a radio associated with the vehicle.

In block 416, simulated EM jamming effects are generated in an EM model sensor in response to receiving an EM jamming command. In some examples, generating the simulated EM jamming effects include generating RADAR jamming effects that are generated in a model RADAR in response to receiving a RADAR jamming command.

In block 418, simulated location jamming effects are generated in a location model sensor in response to receiving a location jamming command. In some examples, generating the simulated location jamming effects includes generating simulated Global Position System (GPS) jamming effects in a GPS model of a GPS associated with the vehicle or aircraft in response to receiving a GPS jamming command. In some examples, generating the simulated location jamming effects includes generating simulated inertial navigation jamming effects in a model of an inertial navigation system associated with the vehicle or aircraft in response to receiving an inertial navigation jamming command.

In some examples, different simulated jamming effects are generated in response to a separate jamming command corresponding to each different simulated jamming effect. In other examples, the different simulated jamming effects are generated in response to a single jamming command.

In accordance with the exemplary simulated environment 204 in FIG. 2, receiving the jamming command includes receiving the jamming command from an entity, e.g., real aircraft 108 or 110, or a ground station 116, in the training exercise 200. Each of the real aircraft 108 or 110 participating in the training exercise 200 in FIG. 2 corresponds to the vehicle 300 in FIG. 3. Receiving the jamming command includes receiving the jamming command from a training system 302. The training system 302 is provided onboard at least one of the live aircraft 108 or another aircraft 110 participating in the training exercise 200 or is located at the ground station 116. Accordingly, the jamming command is received from one of an aggressor real aircraft 110, a friendly real aircraft 108 or the ground station 116. The jamming effect or jamming effects are generated onboard the vehicle 300 in response to receiving the jamming command.

In block 420, the jammer function 324 onboard a platform, e.g., aircraft 108 or 110, merges the jamming effects. As an example of merging the jamming effects, assume a real aircraft 108 or 110 has an onboard GPS location. The "jamming effect" created by the GPS model would create drift that needs to be summed (merged) with the real aircraft GPS positional data. This has the added benefit in that the simulated GPS positional offset created by the simulated jamming can be immediately removed from the real GPS position for safety of flight reasons as decided by the aircrew. Another example of merging jamming effects is the live RADAR onboard the real aircraft 108 or 110. The jammer function 306 needs to influence the results returned from the real RADAR as it is unaware of the simulated jamming effect. Accordingly, the jammer function 306 obfuscates live sensor reports whereas the models in the training system 302 act on virtual/constructive sensor reports.

In block 422, the jamming effects are turned off in response to deactivation by a pilot of the vehicle or by another entity participating in the training exercise 200 (FIG. 2).

Figure 5:
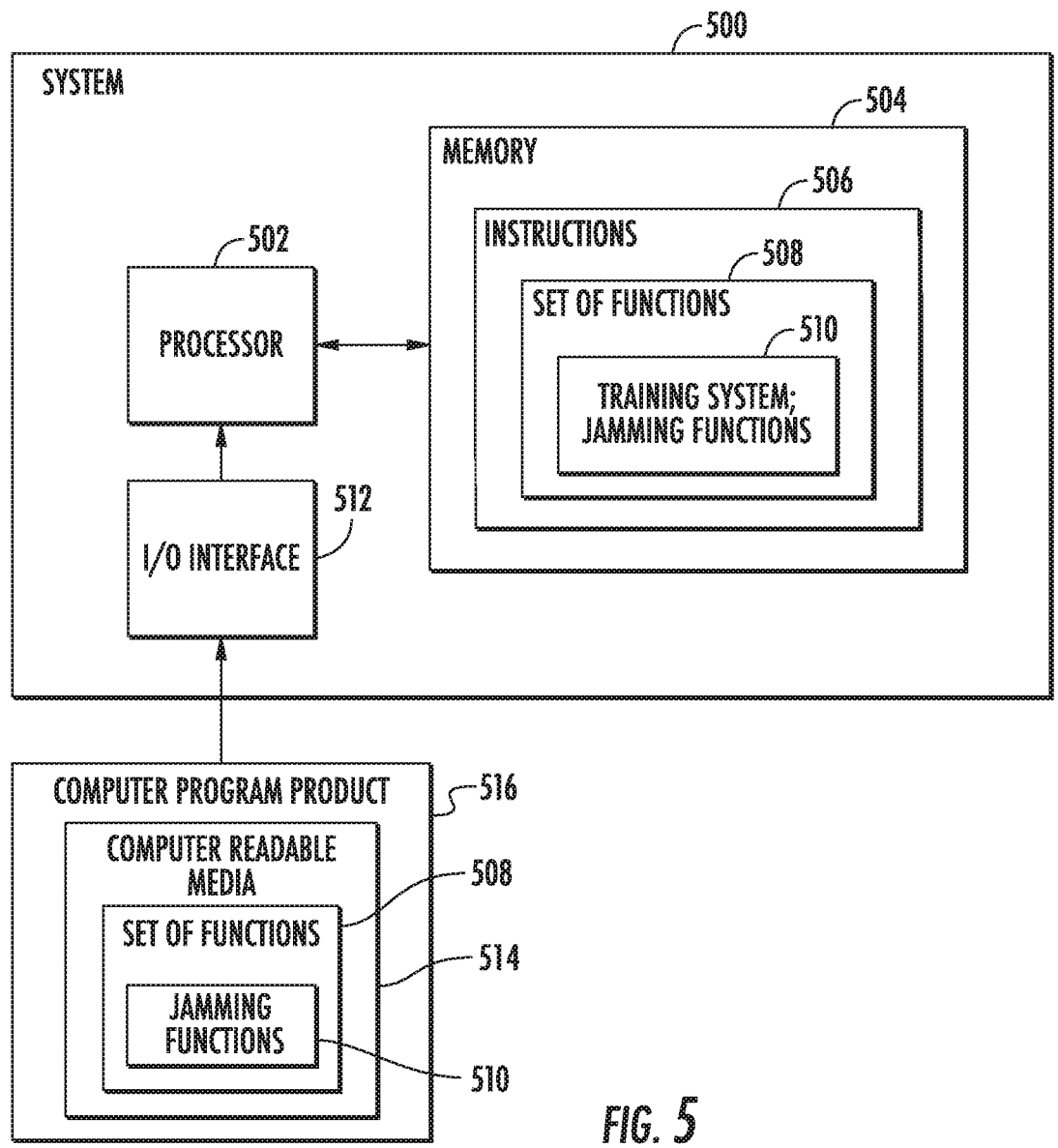
FIG. 5 is a block schematic diagram of an example of a system for providing localized jamming effects in accordance with some examples of the present disclosure.

FIG. 5 is a block schematic diagram of an example of a system 500 for providing localized jamming effects in accordance with some examples of the present disclosure. In some examples, the method 400 or at least parts of the method 400 are embodied in and performed by the system 500. In some examples, the training system 302 or parts of the training system 302, such as the jammer function 324, are embodied in and performed by the system 500. In some examples, the aircraft mission computer 304 is embodied in or at least partially embodied in the system 500.

The system 500 includes a processor 502 and a memory 504 associated with the processor 502. In accordance with some examples, a system, the same as system 500, is onboard each vehicle 300 or each real aircraft 108 and 110, and is located at a ground station 116. The memory 504 includes computer-readable program instructions 506 that, when executed by the processor 502 causes the processor 502 to perform a set of functions 508. In some examples, the set of functions include the method 400 or at least some functions of the method 400, e.g., the functions performed by the vehicle or aircraft mission computer 304. Accordingly, the set of functions 508 include elements 510 of the training system 302 and jammer functions 306 or 324.

The system 500 also includes an input/output (I/O) interface 512 for communications with the system 500 and controlling operation of the system 500. In some examples, the I/O interface 512 is configured to receive the set functions 508 from a computer readable media 514 embodied on a computer program product 516 the same as that previously described.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular examples only and is not intended to be limiting of examples of the disclosure. As used herein, the singular forms "a", "an" and "the" are intended to include the plural forms as well, unless the context clearly indicates otherwise. It will be further understood that the terms "include," "includes," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present examples has been presented for purposes of illustration and description, but is not intended to be exhaustive or limited to examples in the form disclosed. Many modifications and variations will be apparent to those of ordinary skill in the art without departing from the scope and spirit of examples.

Although specific examples have been illustrated and described herein, those of ordinary skill in the art appreciate that any arrangement which is calculated to achieve the same purpose may be substituted for the specific examples shown and that the examples have other applications in other environments. This application is intended to cover any adaptations or variations. The following claims are in no way intended to limit the scope of examples of the disclosure to the specific examples described herein.

What is claimed is:

1. A method for providing localized jamming effects, comprising:
    using a processor onboard a vehicle to perform the steps of:
        receiving a jamming command to simulate a jamming effect on a particular sensor onboard the vehicle;
        generating the jamming effect in a model of the particular sensor in response to the jamming command, wherein the jamming effect in the model of the particular sensor simulates the jamming effect on the particular sensor being generated by an entity other than the vehicle, wherein generating the jamming effect in response to the jamming command comprises generating different simulated jamming effects in response to a single jamming command and merging, using live report data, the different simulated jamming effects by a jammer function on the vehicle; and
        turning off the jamming effect in response to deactivation on the vehicle.

2. The method of claim 1, wherein generating the jamming effect in the model of the particular sensor comprises simulating the jamming effect on the particular sensor.

3. The method of claim 1, wherein generating the jamming effect in the model of the particular sensor comprises at least one of:
  generating simulated communications jamming effects in one or more communications devices associated with the vehicle;
  generating simulated electromagnetic jamming effects in a sensor model of an electromagnetic sensor associated with the vehicle; and
  generating simulated location data jamming effects in a model of a location sensor associated with the vehicle.

4. The method of claim 3, wherein generating the simulated communications jamming effects comprises generating radio interference on a radio associated with the vehicle.

5. The method of claim 3, wherein generating the simulated location jamming effects comprises generating simulated Global Position System (GPS) jamming effects in a GPS model of a GPS associated with the vehicle.

6. The method of claim 3, wherein generating the simulated location jamming effects comprises generating simulated inertial navigation jamming effects in a model of an inertial navigation system associated with the vehicle.

7. The method of claim 1, wherein the vehicle comprises a live aircraft participating in a training exercise and wherein receiving the jamming command comprises receiving the jamming command from a training system.

8. The method of claim 7, further comprising at least one of:
  providing the training system onboard the live aircraft;
  providing the training system onboard another aircraft; or
  locating the training system at a ground station.

9. The method of claim 1, wherein the vehicle is a live aircraft participating in a training exercise and wherein receiving the jamming command comprises receiving the jamming command from one of an aggressor aircraft, a friendly aircraft, or a ground station.

10. A system for providing localized jamming effects, comprising:
  a processor onboard a vehicle; and
  a memory associated with the processor, the memory comprising computer-readable program instructions that, when executed by the processor causes the processor to perform a set of functions comprising:
    receiving a jamming command to simulate a jamming effect on a particular sensor onboard the vehicle;
    generating the jamming effect in a model of the particular sensor in response to the jamming command, wherein the jamming effect in the model of the particular sensor simulates the jamming effect on the particular sensor being generated by an entity other than the vehicle, wherein generating the jamming effect in response to the jamming command comprises generating different simulated jamming effects in response to a single jamming command and merging, using live report data, the different simulated jamming effects by a jammer function on the vehicle; and
    turning off the jamming effect in response to deactivation on the vehicle.

11. The system of claim 10, wherein the jamming effect in the model of the particular sensor simulates the jamming effect on the particular sensor.

12. The system of claim 10, wherein the set of functions further comprises at least one of:
  generating simulated communications jamming effects in one or more communications devices associated with the vehicle;
  generating simulated radar jamming effects in a radar model of a radar associated with the vehicle; and
  generating simulated location data jamming effects in a model of a location sensor associated with the vehicle.

13. The system of claim 10, further comprising a training system, the training system comprising:
  a radio interference generator;
  a radar model of a radar associated with the vehicle;
  a model of a location sensor associated with the vehicle; and
  a jammer function, wherein the jammer function is configured to:
    generate simulated communications jamming effects in a communications device associated with the vehicle;
    generate simulated radar jamming effects in the radar model of the radar associated with the vehicle; and
    generate simulated location data jamming effects in the model of a location sensor associated with the vehicle.

14. The system of claim 13, wherein the vehicle comprises a live aircraft participating in the training exercise and the jamming command is received from a training system.

15. The system of claim 14, further comprising at least one of:
  the training system is onboard the live aircraft;
  the training system is onboard another aircraft; or
  the training system is at a ground station.

16. A training pod, comprising:
  a training system, the training system comprising:
    a radio interference generator;
    a radar model of a radar associated with a vehicle;
    a model of a location sensor associated with the vehicle; and
    a jammer function, wherein the jammer function is configured to:
      generate simulated communications jamming effects in a communications device associated with the vehicle;
      generate simulated radar jamming effects in the radar model of the radar associated with the vehicle;
      generate simulated location data jamming effects in the model of a location sensor associated with the vehicle, wherein generating the simulated communications jamming effects, the simulated radar jamming effects and the simulated location data jamming effects is in response to a single received jamming command;
    merging, using live report data, the different simulated jamming effects by the jammer function or another jammer function on the vehicle; and
    turn off the simulated communications jamming effects, the simulated radar jamming effects and the simulated location data jamming effects in response to deactivation on the vehicle.

17. The training pod of claim 16, wherein the training pod is removably mounted to an aircraft.

* * * * *